(12) United States Patent
Hanaoka

(10) Patent No.: US 7,144,760 B2
(45) Date of Patent: Dec. 5, 2006

(54) SEMICONDUCTOR DEVICE, METHOD OF MANUFACTURING THE SAME, CIRCUIT BOARD, AND ELECTRONIC EQUIPMENT

(75) Inventor: Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 73 days.

(21) Appl. No.: 10/667,331

(22) Filed: Sep. 23, 2003

(65) Prior Publication Data

US 2004/0115902 A1  Jun. 17, 2004

(30) Foreign Application Priority Data

Oct. 15, 2002 (JP) .............................. 2002-300263

(51) Int. Cl.
  H01L 21/00 (2006.01)
  H01L 21/44 (2006.01)
  H01L 21/48 (2006.01)
  H01L 21/46 (2006.01)
  H01L 21/78 (2006.01)
(52) U.S. Cl. ....................................... 438/113; 438/460
(58) Field of Classification Search ................ 438/107, 438/108, 109, 113, 114, 460
  See application file for complete search history.

(56) References Cited

U.S. PATENT DOCUMENTS 6,333,565 B1 * 12/2001 Hashimoto .................. 257/781
6,389,689 B1 * 5/2002 Heo .............................. 29/840
6,707,153 B1   3/2004 Kuwabara et al.
6,897,127 B1 * 5/2005 Hanaoka .................... 438/460
2002/0008320 A1  1/2002 Kuwabara et al.
2003/0109079 A1 * 6/2003 Yamaguchi et al. ........ 438/107

FOREIGN PATENT DOCUMENTS

| JP | A 10-027971 | 1/1998 |
| JP | A 11-297873 | 10/1999 |
| JP | A 2000-243754 | 9/2000 |
| WO | WO 01/71805 A1 | 9/2001 |

OTHER PUBLICATIONS

U.S. Appl. No. 09/700,464, filed Nov. 15, 2000, Hanaoka.
U.S. Appl. No. 10/654,449, filed Sep. 4, 2003, Hanaoka.
U.S. Appl. No. 10/679,467, filed Oct. 7, 2003, Hanaoka.

* cited by examiner

Primary Examiner—Walter L. Lindsay, Jr.
(74) Attorney, Agent, or Firm—Oliff & Berridge, PLC

(57) ABSTRACT

A wiring pattern is formed over a semiconductor wafer, in which an interconnect is formed from an integrated circuit, from a pad which is a part of the interconnect, and an external terminal is formed on the wiring pattern. A resin layer is formed on the semiconductor wafer. A mask layer having an opening pattern is formed on the resin layer. A part of the resin layer is removed in a state in which the mask layer is disposed on the resin layer to form an opening in the resin layer. The semiconductor wafer is cut along the opening.

14 Claims, 6 Drawing Sheets

SEMICONDUCTOR DEVICE, METHOD OF MANUFACTURING THE SAME, CIRCUIT BOARD, AND ELECTRONIC EQUIPMENT

Japanese Patent Application No. 2002-300263 filed on Oct. 15, 2002, is hereby incorporated by reference in its entirety.

BACKGROUND OF THE INVENTION

The present invention relates to a semiconductor device, a method of manufacturing the same, a circuit board, and electronic equipment.

Bare chip mounting is ideal in order to enable high density mounting of a semiconductor device. However, a guarantee of quality and handling of the bare chip are difficult. Therefore, a semiconductor device to which a chip scale/size package (CSP) is applied has been developed. In particular, a wafer level CSP which is manufactured at the wafer level has attracted attention in recent years. In the wafer level CSP, a wiring pattern and external terminals (solder balls, for example) are formed over a semiconductor wafer, and a plurality of semiconductor devices are formed by dicing the semiconductor wafer. There may be a case where a resin layer is formed to reinforce the lower part of the external terminals. In this case, since the resin layer is also diced when dicing the semiconductor wafer, clogging of a dicing blade occurs. Therefore, it is difficult to dice the semiconductor wafer so as to prevent breakage of the edge of the semiconductor chip. If the edge of the semiconductor chip breaks, reliability of the semiconductor device is decreased.

BRIEF SUMMARY OF THE INVENTION

A method of manufacturing a semiconductor device according to one aspect of the present invention comprises:

forming a wiring pattern over a semiconductor wafer, in which an interconnect is formed from an integrated circuit, from a pad which is a part of the interconnect, and forming an external terminal on the wiring pattern;

forming a resin layer on the semiconductor wafer;

forming a mask layer having an opening pattern on the resin layer;

removing a part of the resin layer in a state in which the mask layer is disposed on the resin layer to form an opening in the resin layer; and cutting the semiconductor wafer along the opening.

A semiconductor device according to another aspect of the present invention is manufactured by using the above method.

A circuit board according to a further aspect of the present invention has the above semiconductor device mounted thereon.

Electronic equipment according to a still further aspect of the present invention comprises the above semiconductor device.

DETAILED DESCRIPTION OF THE EMBODIMENT

The present invention may prevent a decrease in reliability relating to a semiconductor device, a method of manufacturing the semiconductor device, a circuit board, and electronic equipment.

(1) A method of manufacturing a semiconductor device according to one embodiment of the present invention comprises:

forming a wiring pattern over a semiconductor wafer, in which an interconnect is formed from an integrated circuit, from a pad which is a part of the interconnect, and forming an external terminal on the wiring pattern;

forming a resin layer on the semiconductor wafer;

forming a mask layer having an opening pattern on the resin layer;

removing a part of the resin layer in a state in which the mask layer is disposed on the resin layer to form an opening in the resin layer; and cutting the semiconductor wafer along the opening.

According to this method of manufacturing a semiconductor device, since the resin layer is removed from the first region along which the semiconductor wafer is cut, the semiconductor wafer can be cut in an ideal manner. This prevents a decrease in reliability.

(2) In this method of manufacturing a semiconductor device, the mask layer may be formed of a resin.

(3) In this method of manufacturing a semiconductor device, the mask layer may be formed of a dry film.

(4) In this method of manufacturing a semiconductor device, a part of the resin layer may be removed by sandblasting or etching.

(5) In this method of manufacturing a semiconductor device, the resin layer may be formed to cover at least a lower part of the external terminal.

(6) In this method of manufacturing a semiconductor device, an insulating layer may be formed on the semiconductor wafer, and the wiring pattern may be formed over the insulating layer.

(7) In this method of manufacturing a semiconductor device, the insulating layer may be formed avoiding a region over which the opening is formed.

(8) This method of manufacturing a semiconductor device may further comprise forming a solder resist layer so as to cover the wiring pattern excluding a region in which the external terminal is formed before forming the resin layer.

(9) In this method of manufacturing a semiconductor device, the solder resist layer may be formed avoiding a region over which the opening is formed.

(10) A semiconductor device according to another embodiment of the present invention is manufactured by using the above method.

(11) A circuit board according to a further embodiment of the present invention has the above semiconductor device mounted thereon.

(12) Electronic equipment according to a still further embodiment of the present invention comprises the above semiconductor device.

Figure 1A:
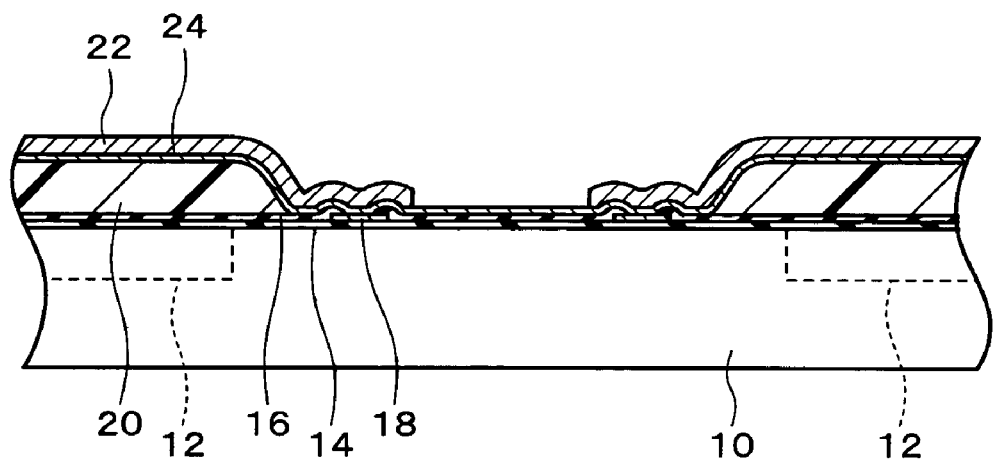
FIGS. 1A to 1C are illustrative of a method of manufacturing a semiconductor device according to an embodiment of the present invention.

FIGS. 1A to 4B are illustrative of a method of manufacturing a semiconductor device according to an embodiment of the present invention. In this embodiment, a semiconductor wafer 10 (see FIG. 5) is used. As shown in FIG. 1A, an integrated circuit 12 is formed in the semiconductor wafer 10. In the case of cutting the semiconductor wafer 10 into a plurality of semiconductor chips, a plurality of the integrated circuits 12 are formed in the semiconductor wafer 10, and each of the semiconductor chips includes the integrated circuit 12.

One or more passivation films 14 and 16 may be formed on the surface of the semiconductor wafer 10. The passivation film 16 may be formed of a polyimide resin or the like on the passivation film 14 formed of $SiO_2$, SiN, or the like, for example.

A pad 18 is formed on the semiconductor wafer 10. The pad 18 is a part (end portion) of an interconnect which is electrically connected with the integrated circuit 12. The passivation film 16 is formed avoiding at least the center of the pad 18.

An insulating layer 20 may be formed on the passivation films 14 and 16 on the semiconductor wafer 10. The insulating layer 20 may be formed of a plurality of layers or a single layer. The insulating layer 20 may have a stress relief function. The insulating layer 20 may be formed of a resin such as a polyimide resin, silicone-modified polyimide resin, epoxy resin, silicone-modified epoxy resin, benzocyclobutene (BCB), or polybenzoxazole (PBO). The insulating layer 20 may be formed avoiding a first region (cutting region) 32.

In this embodiment, a wiring pattern 22 is formed over the semiconductor wafer 10 as shown in FIG. 1A. The wiring pattern 22 may be formed from the pad 18 and over the insulating layer 20. The wiring pattern 22 is formed as follows, for example. A single layer or multilayer conductive film 24 is formed on the semiconductor wafer 10. For example, the conductive film 24 may be formed by a titanium tungsten (TiW) film and a copper (Cu) film formed on the TiW film. The conductive film 24 may be formed by sputtering. The conductive film 24 is formed at least in the region in which the wiring pattern 22 is formed. The conductive film 24 may be formed over the entire surface of the semiconductor wafer 10 on which the pad 18 is formed. A plating resist layer (not shown) is formed on the conductive film 24 avoiding the region in which the wiring pattern 22 is formed. The plating resist layer formed on the conductive film 24 may be patterned after performing a photolithography step and the like. The wiring pattern 22 is formed on the conductive film 24 in the opening region of the plating resist layer by electroplating using the conductive film 24 as an electrode. The wiring pattern 22 may be formed by electroless plating.

Figure 1B:
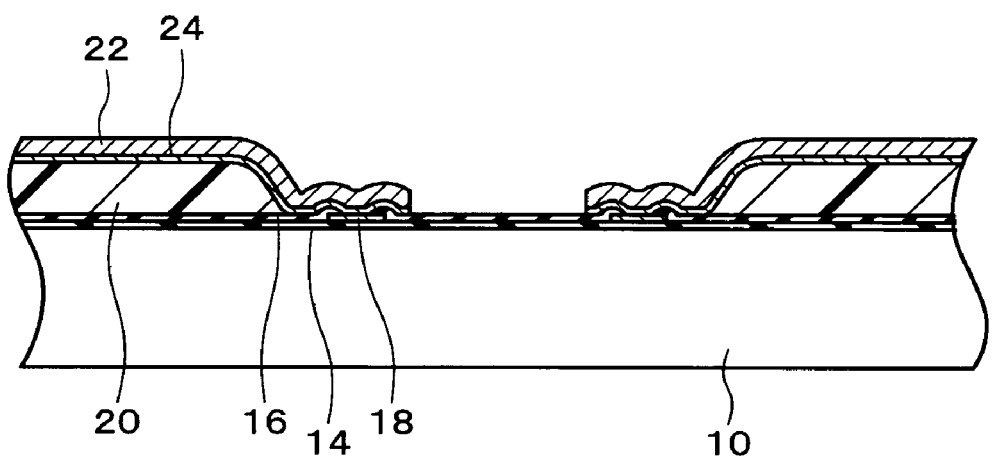

The conductive film 24 is patterned as shown in FIG. 1B when the wiring patterns 22 are electrically connected with each other by the conductive film 24. For example, the conductive film 24 may be etched by using the wiring pattern 22 as a mask.

Figure 1C:
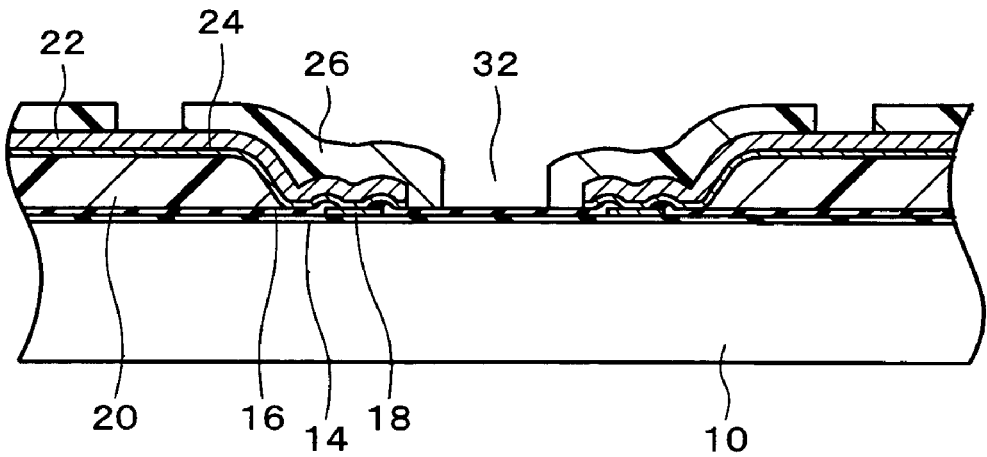

As shown in FIG. 1C, a solder resist layer 26 may be formed. The solder resist layer 26 is formed before forming a resin layer 30 as described later. For example, the solder resist layer 26 may be formed to cover the wiring pattern 22 excluding the region in which an external terminal 28 is formed (at least part of a land, for example). The solder resist layer 26 may be formed avoiding the first region 32. The solder resist layer 26 may be formed at an interval from the first region 32.

Figure 2A:
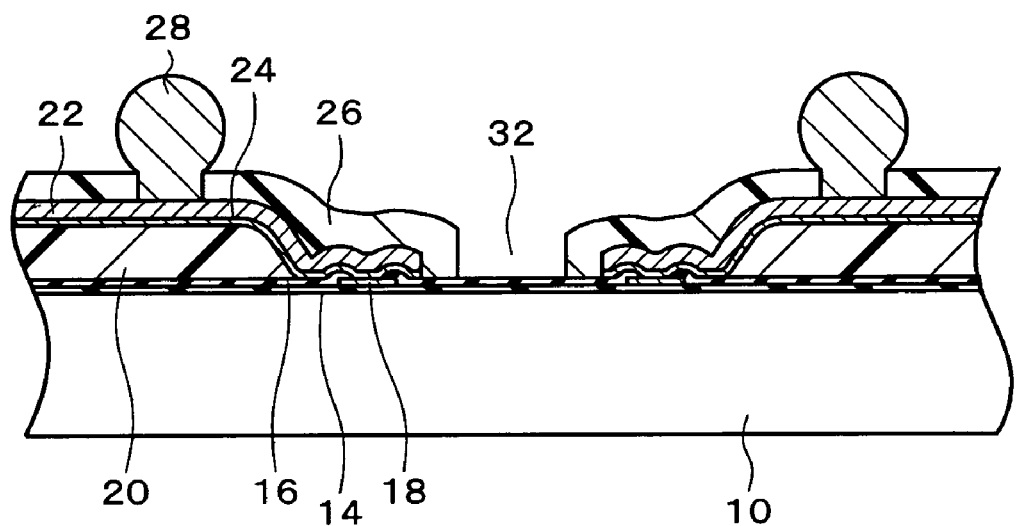
FIGS. 2A and 2B are illustrative of a method of manufacturing a semiconductor device according to an embodiment of the present invention.

As shown in FIG. 2A, the external terminal 28 may be formed on the wiring pattern 22. The external terminal 28 may be formed of a filler metal (soft solder or hard solder). For example, the external terminal 28 may be a solder ball.

Figure 2B:
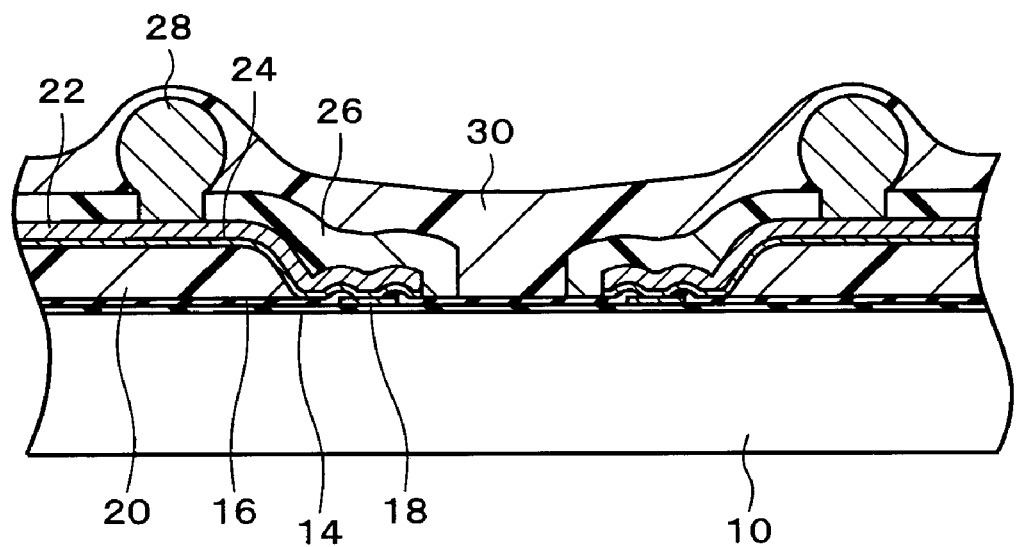

The resin layer 30 is formed as shown in FIG. 2B. The resin layer 30 is formed in a second region 34 other than the first region (cutting region) 32 when cutting the semiconductor wafer 10. The resin layer 30 is initially formed in the first region 32. The resin layer 30 is formed to cover the external terminals 28. Since the external terminal 28 projects upward, the thickness of the resin layer 30 in a portion over the top end of the external terminal 28 is thinner than the other portion of the resin layer 30.

Figure 3A:
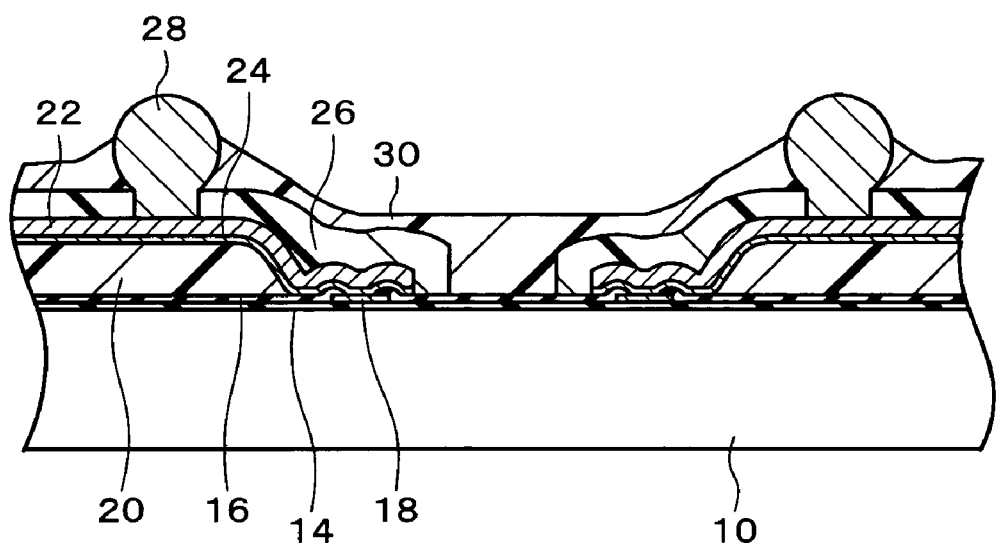
FIGS. 3A and 3B are illustrative of a method of manufacturing a semiconductor device according to an embodiment of the present invention.

As shown in FIG. 3A, a part (end portion, for example) of the external terminal 28 is exposed by removing at least part of a portion of the resin layer 30 over the external terminal 28. The resin layer 30 may be removed by dry etching using plasma or the like. The resin layer 30 is thus patterned to surround at least the lower part of the external terminal 28. This enables thermal stress applied to the external terminal 28 to be reduced. The resin layer 30 is formed of a polyimide resin or the like. The coefficient of (linear) thermal expansion of the resin layer 30 may be greater than that of the insulating layer 20.

Figure 3B:
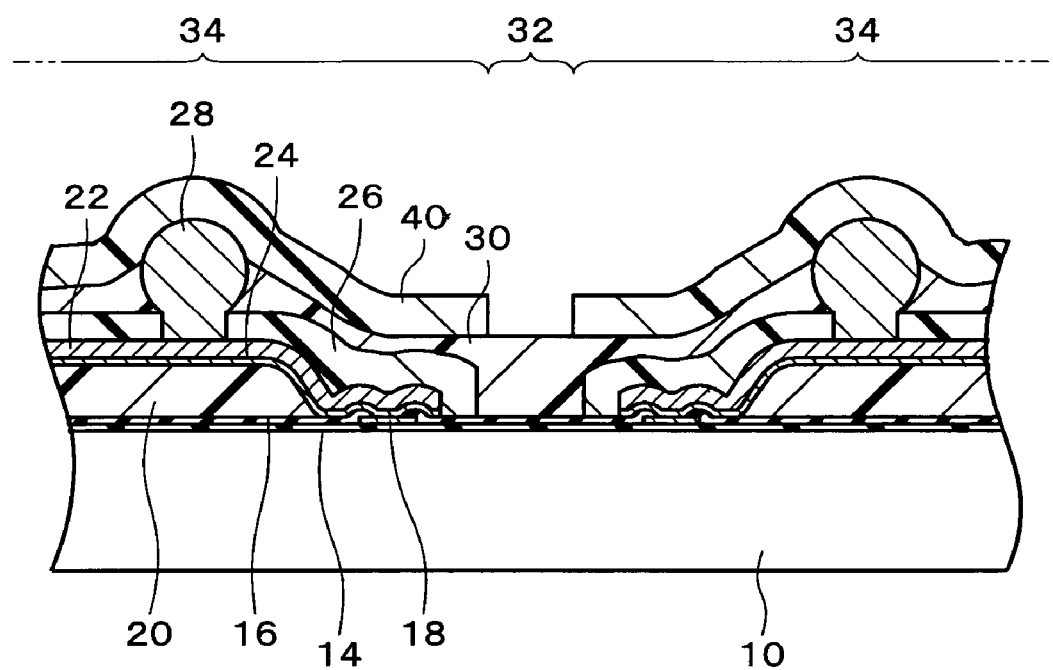

As shown in FIG. 3B, a mask layer 40 having an opening pattern is formed on the resin layer 30. The mask layer 40 is opened in the first region 32 and covers the second region 34. The first region 32 is the cutting (dicing, for example) region of the semiconductor wafer 10. The second region 34 is a region other than the first region 32 (region which becomes a semiconductor chip, for example). The first region 32 may be a region in the shape of a lattice. At least a part of the first region 32 may be a region which surrounds the second region 34. The mask layer 40 may be formed of a resin. The mask layer 40 may be formed of a dry film. Since the material for the mask layer 40 is not necessarily photosensitive, the degrees of freedom of material selection are increased.

The resin layer 30 is removed in the area along the first region 32 in a state in which the mask layer 40 is disposed on the resin layer 30 to form an opening. A portion of the resin layer 30 in the second region 34 is allowed to remain. A portion of the resin layer 30 in the first region 32 may be removed by sandblasting or etching (dry etching or wet etching). The resin layer 30 need not be removed completely. A part or a residue of the resin layer 30 may remain if cutting (dicing) is not affected to a large extent. The mask layer 40 is removed if necessary.

Figure 4:
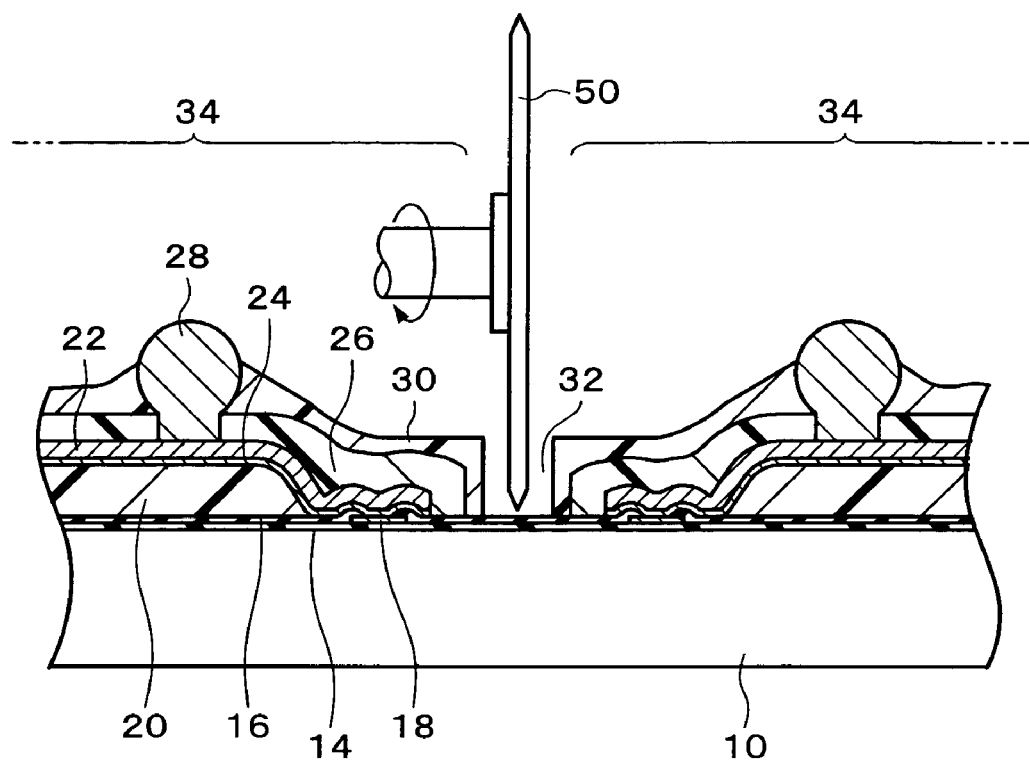
FIG. 4 is illustrative of a method of manufacturing a semiconductor device according to an embodiment of the present invention.
Figure 5:
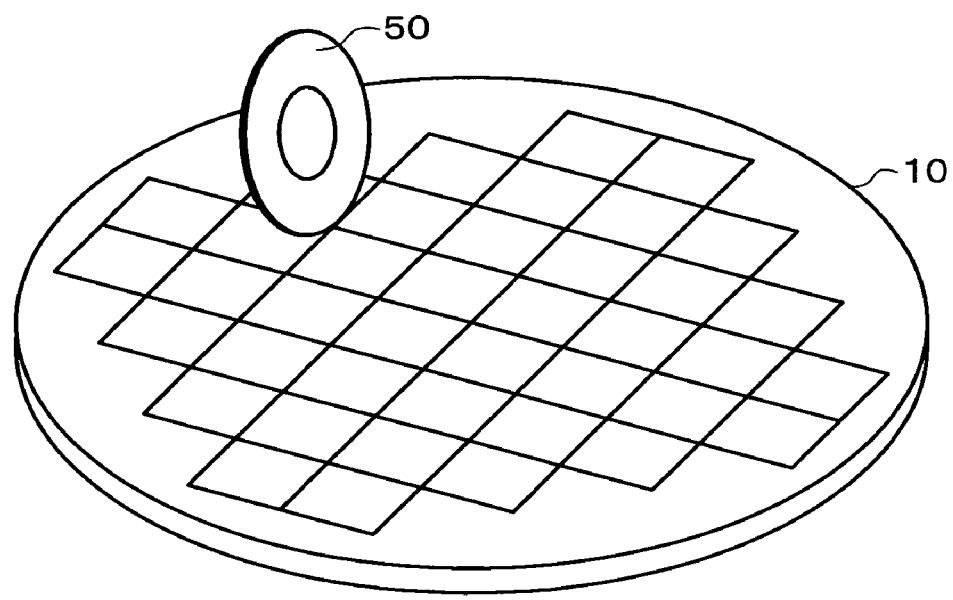
FIG. 5 is illustrative of a method of manufacturing a semiconductor device according to an embodiment of the present invention.

As shown in FIGS. 4 and 5, the semiconductor wafer 10 is cut (diced) along the first region 32. Specifically, the semiconductor wafer is cut along the opening of the resin layer 30. The opening may be formed along the cutting line. The semiconductor wafer 10 may be cut by using a blade 50. In this case, the semiconductor wafer 10 may be cut in a state in which a tape (not shown) or the like adheres to the semiconductor wafer 10.

Since the resin layer 30 is eliminated in the first region 32 (cutting region), clogging of the blade 50 rarely occurs, whereby breakage of the edge of the semiconductor chip can be prevented. Therefore, a highly reliable semiconductor device can be manufactured.

Figure 6:
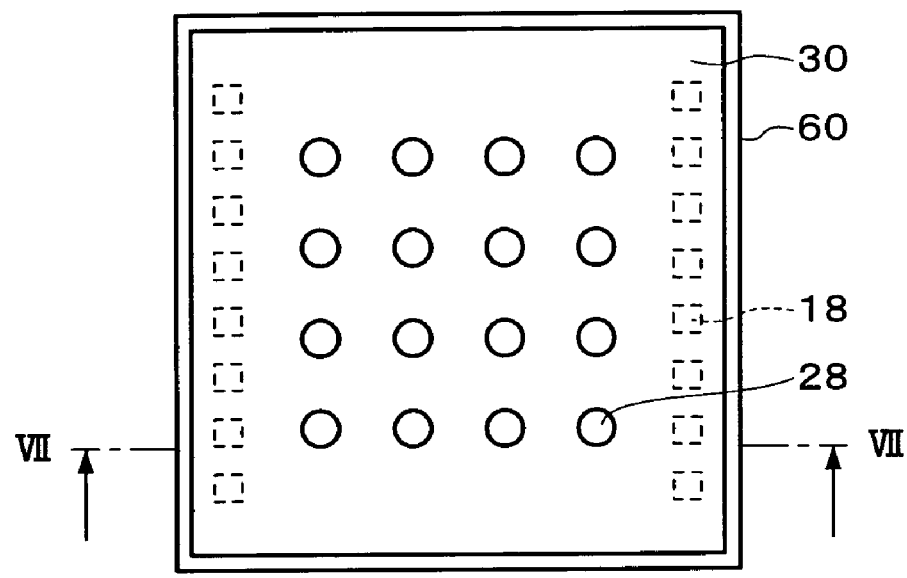
FIG. 6 is illustrative of a semiconductor device according to an embodiment of the present invention.
Figure 7:
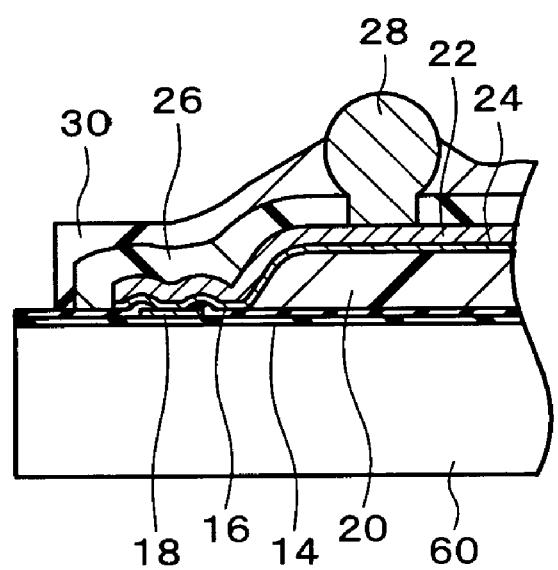
FIG. 7 is a partial cross-sectional view along the line VII—VII shown in FIG. 6.

FIG. 6 shows a semiconductor device manufactured by the above-described steps. FIG. 7 is a partial cross-sectional view along the line VII—VII shown in FIG. 6. The semiconductor device includes a semiconductor chip 60. The semiconductor chip 60 is obtained by dicing the semiconductor wafer 10. The elements formed by the above-described steps are formed on the semiconductor chip 60. The edge of the resin layer 30 is located inside the edge of the semiconductor chip 60. The other details can be derived from the above description. Therefore, further description is omitted.

According to this embodiment, since a part of the resin layer 30 is removed from the first region 32, the semiconductor wafer 10 can be cut optimally. This prevents a decrease in reliability.

Figure 8:
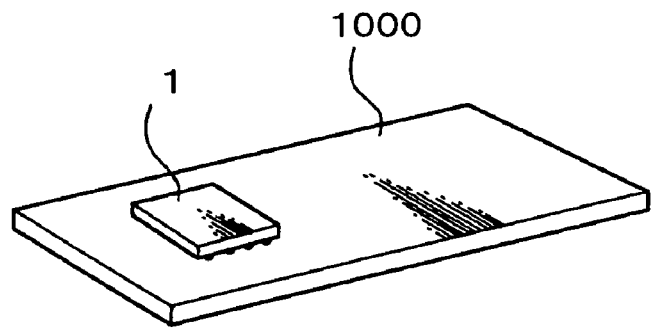
FIG. 8 shows a circuit board on which a semiconductor device according to an embodiment of the present invention is mounted.

FIG. 8 shows a circuit board 1000 on which a semiconductor device 1 according to this embodiment is mounted. An organic substrate such as a glass epoxy substrate is generally used as the circuit board 1000. An interconnect pattern is formed of copper or the like on the circuit board 1000 so as to form a desired circuit. The interconnect pattern and the semiconductor device 1 are electrically connected by mechanically connecting the interconnect pattern with the external terminals 28 of the semiconductor device 1.

Figure 9:
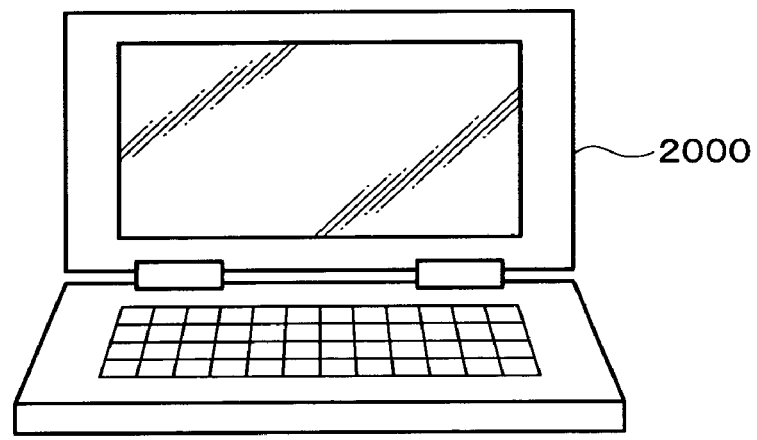
FIG. 9 shows electronic equipment including a semiconductor device according to an embodiment of the present invention.
Figure 10:
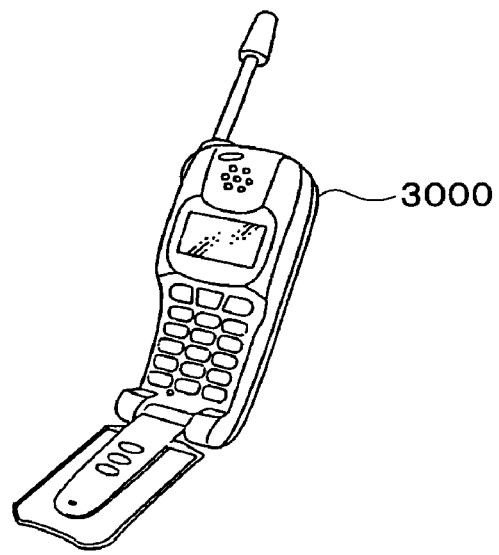
FIG. 10 is another type of electronic equipment including a semiconductor device according to an embodiment of the present invention.

FIGS. 9 and 10 respectively show a notebook-type personal computer 2000 and a portable telephone 3000 as examples of electronic equipment including the semiconductor device 1 to which the present invention is applied.

What is claimed is:

1. A method of manufacturing a semiconductor device comprising:
   forming an insulating layer on a semiconductor wafer;
   forming a wiring pattern over the insulating layer, in which an interconnect is formed from an integrated circuit, from a pad which is a part of the interconnect, and forming an external terminal on the wiring pattern;
   forming a resin layer on the insulating layer and over the semiconductor wafer to cover at least a lower part of the external terminal;
   forming a mask layer having an opening pattern on the resin layer;
   removing a part of the resin layer in a state in which the mask layer is disposed on the resin layer to form an opening in the resin layer; and
   cutting the semiconductor wafer along the opening.

2. The method of manufacturing a semiconductor device as defined in claim 1, wherein the mask layer is formed of a resin.

3. The method of manufacturing a semiconductor device as defined in claim 1, wherein the mask layer is formed of a dry film.

4. The method of manufacturing a semiconductor device as defined in claim 1, wherein a part of the resin layer is removed by sandblasting or etching.

5. The method of manufacturing a semiconductor device as defined in claim 1, wherein the insulating layer is formed avoiding a region over which the opening is formed.

6. The method of manufacturing a semiconductor device as defined in claim 1, wherein the insulating layer is formed avoiding a region over which the opening is formed.

7. The method of manufacturing a semiconductor device as defined in claim 1, further comprising:
   forming a solder resist layer so as to cover the wiring pattern excluding a region in which the external terminal is formed before forming the resin layer.

8. The method of manufacturing a semiconductor device as defined in claim 1, further comprising:
   forming a solder resist layer so as to cover the wiring pattern excluding a region in which the external terminal is formed before forming the resin layer.

9. The method of manufacturing a semiconductor device as defined in claim 5, further comprising:
   forming a solder resist layer so as to cover the wiring pattern excluding a region in which the external terminal is formed before forming the resin layer.

10. The method of manufacturing a semiconductor device as defined in claim 6, further comprising:
    forming a solder resist layer so as to cover the wiring pattern excluding a region in which the external terminal is formed before forming the resin layer.

11. The method of manufacturing a semiconductor device as defined in claim 7, wherein the solder resist layer is formed avoiding a region over which the opening is formed.

12. The method of manufacturing a semiconductor device as defined in claim 8, wherein the solder resist layer is formed avoiding a region over which the opening is formed.

13. The method of manufacturing a semiconductor device as defined in claim 9, wherein the solder resist layer is formed avoiding a region over which the opening is formed.

14. The method of manufacturing a semiconductor device as defined in claim 10, wherein the solder resist layer is formed avoiding a region over which the opening is formed.

* * * * *